(12) United States Patent
Jiang et al.

(10) Patent No.: US 11,377,345 B2
(45) Date of Patent: Jul. 5, 2022

(54) TUNABLE PHOTONIC DEVICE WITH LIQUID CRYSTAL ELASTOMER MICROACTUATORS AND METHOD OF FABRICATING THE SAME

(71) Applicant: Wisconsin Alumni Research Foundation, Madison, WI (US)

(72) Inventors: Hongrui Jiang, Madison, WI (US); Jae-Jun Kim, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 167 days.

(21) Appl. No.: 16/923,731

(22) Filed: Jul. 8, 2020

(65) Prior Publication Data
US 2022/0009765 A1 Jan. 13, 2022

(51) Int. Cl.
*B81B 3/00* (2006.01)
*F03G 7/00* (2006.01)
*G02F 1/1333* (2006.01)
*G02B 26/00* (2006.01)

(52) U.S. Cl.
CPC .......... *B81B 3/0029* (2013.01); *F03G 7/005* (2013.01); *G02F 1/133362* (2013.01); *B81B 2201/038* (2013.01); *G02B 26/004* (2013.01)

(58) Field of Classification Search
CPC ............ B81B 3/0029; B81B 2201/038; G02F 1/133362; G02F 1/135; G02B 26/004
See application file for complete search history.

(56) References Cited

U.S. PATENT DOCUMENTS

| | | | |
|---|---|---|---|
| 8,072,688 B2 | 12/2011 | Krupenkin | |
| 2012/0295058 A1* | 11/2012 | Brosnihan | B81C 1/00261 428/117 |

OTHER PUBLICATIONS

A. Ousati Ashtiani et al., "Design and fabrication of an electrohyrodynamically actuated microlens with areal density modulated electrodes," Journal of Micromechanics and Microengineering, 26 (2016) 015004 (9pp).
Jian Li et al., "DRIE—Fabricated Curved-Electrode Zipping Actuators With Low Pull-in Voltage," Transducers '03, 2th International Conference on Solid-State Sensors, Actuators and Microsystems, Boston, Jun. 8-12, 2003, pp. 480-483.
C. Divoux et al., "A Novel Electrostatic Actuator For Micro Deformable Mirrors: Fabrication And Test," Tranducers '03, 12th International Conference on Solid-State Sensors, Actuators and Microsystems, Boston, Jun. 8-12, 2003, pp. 488-491.
L. Maffli et al., "Mm-size bistable zipping dielectric elastomer actuators for integrated microfluidics," Proc. SPIE, vol. 8687, 86872M, Apr. 9, 2013, 2013.
A. Ousati Ashtiani et al., "An Electrohydrodynamically Actuated Liquid Microlens With Areal Density Modulated Electrodes," Transducers 2015, Anchorage, Alaska Jun. 21-25, 2015, pp. 2089-2092.

* cited by examiner

*Primary Examiner* — Donald L Raleigh
(74) *Attorney, Agent, or Firm* — Boyle Fredrickson, S.C.

(57) ABSTRACT

A tunable photonic device and method of fabricating the same are provided. The tunable photonic device including a substrate and an actuator having a first end supported by the substrate and a second end in spaced relation to the substrate. A photonic structure is operatively connected to the actuator and a stimulus generator configured to selectively generate a stimulus to act on the actuator. The stimulus acting on the actuator causes deformation of the actuator and moves the photonic structure between first and second positions.

23 Claims, 6 Drawing Sheets

TUNABLE PHOTONIC DEVICE WITH LIQUID CRYSTAL ELASTOMER MICROACTUATORS AND METHOD OF FABRICATING THE SAME

REFERENCE TO GOVERNMENT GRANT

This invention was made with government support under 1329481 awarded by the National Science Foundation and EB019460 awarded by the National Institutes of Health. The government has certain rights in the invention.

FIELD OF THE INVENTION

This invention relates generally to photonic devices, and in particular, to a tunable photonic device actuated by liquid crystal elastomer (LCE) microactuators and a method of manufacturing the same.

BACKGROUND AND SUMMARY OF THE INVENTION

The miniaturization of technological components, such as photonic devices, is rapidly advancing. The more complex miniaturized devices often require some sort of actuator, which is the component responsible for moving and controlling a mechanism or system such as a photonic element. Due to the scale, microactuators used in these devices have additional requirements, such as microstructure and integration ability.

Polymers have been considered to be candidate materials for microactuators due to their controllable properties. One class of polymers considered as a candidate is known as liquid crystal elastomers (LCEs). LCEs are slightly cross-linked liquid crystalline polymer networks that exhibit fully reversible and large-amplitude shape-response when triggered by external stimuli. Due to these actuation properties, LCEs appear to be the ideal candidate materials for micro-actuator applications.

While LCEs exhibit a number of remarkable physical characteristics, the implementation of LCEs for microactuator applications has been somewhat limited for a variety of reasons. For example, while LCE actuators at the centimeter and millimeter scale have been successfully demonstrated, there are challenges around the fabrication of responsive materials that can be employed in the realization of tunable devices at the micro and nano scale. For good actuation, it is necessary for any actuator fabricated from LCE to have good liquid crystal alignment. However, the fabrication process of LCE films can result in liquid crystal alignment issues. As such, despite the physical characteristics of LCE, current tunable micro/nano photonic devices do not have multi-mode optical tunability and have limited optical applications. Further, due to the fragility of LCE films and the liquid crystal alignment issues, it can be challenging to process a LCE film with integrated microstructures or to integrate a microstructure after the LCE film has been cut.

In view of the foregoing, it is a primary object and feature of a present invention to provide a tunable photonic device actuated by liquid crystal elastomer (LCE) microactuators and a method of fabricating the same.

It is a further object and feature of the present invention to provide a tunable photonic device that exhibits fully reversible shape-response when triggered by external stimuli.

It is still a further object and feature of the present invention to provide a tunable photonic device that is simple and inexpensive to fabricate.

In accordance with present invention, a tunable photonic device is provided. The tunable photonic device includes a substrate having an upper surface and an actuator having a first end supported by the substrate and a second end in spaced relation to the substrate. A photonic structure is operatively connected to the actuator and is movable between a first position wherein the photonic structure lies in a first plane and a second position wherein the photonic structure lies in a second plane. The photonic structure is configured to perform one or more of scattering, refracting, confining, filtering and processing light. A stimulus generator is configured to selectively generate a stimulus to act on the actuator. The stimulus acting on the actuator causes deformation of the actuator and moves the photonic structure between the first and second positions.

The actuator is fabricated from a liquid crystal elastomer and an anchor interconnects the actuator and the substrate. The anchor supports the first end of actuator in spaced relation to the upper surface of the substrate. The stimulus may be heat and the stimulus generator may include a microheater embedded in the upper surface of the substrate and generating heat to act on the actuator. Alternatively, the microheater may be positioned adjacent a lower surface of the substrate to generate heat that acts on the actuator.

The actuator may be a first actuator and the photonic structure may be a first photonic structure. As such, the tunable photonic device may also include a second actuator having a first end supported by the substrate and a second end in spaced relation to the substrate. A second photonic structure is operatively connected to the second end of the second actuator and is movable between a first position wherein the second photonic structure lies in the first plane and a second position wherein the second photonic structure lies in a third plane intersecting the substrate. The second photonic structure is configured to perform one or more of scattering, refracting, confining, filtering and processing light. The stimulus generator may be a first stimulus generator and the tunable photonic device may also include a second stimulus generator configured to selectively generate a stimulus to act on the second actuator. The first photonic structure may be operatively connected to the first end of the second actuator. The photonic structure may be operatively connected to the second end of the actuator.

In accordance with a further aspect of the present invention, a tunable photonic device is provided. The tunable photonic device includes a substrate having an upper surface and a plurality of actuators arranged in a pattern on the upper surface of the substrate. A plurality of photonic structures is also provided. Each photonic structure is operatively connected to at least one of the plurality of actuators and is movable between a first position wherein the photonic structure lies in a first plane and a second position wherein the photonic structure lies in a second plane. A stimulus generator is configured to generate a stimulus to selectively act on one or more of the plurality of actuators. The stimulus acting on the one or more of the plurality of actuators causes one or more of the plurality of photonic structure operatively connected to the one or more of the plurality of actuators to move between the first and second positions.

The plurality of actuators is fabricated from liquid crystal elastomers. A plurality of anchors is also provided. Each anchor interconnects a first end of one of the plurality of actuators and the substrate and supports the first end of actuator in spaced relation to the upper surface of the substrate. The stimulus may be heat and the stimulus generator may include a plurality of microheaters embedded in the upper surface of the substrate. Each microheater generates heat to act on at least one of the plurality of actuators. Alternatively, the plurality of microheaters may be positioned adjacent a lower surface of the substrate. Each of the plurality of microheaters generates heat to act on at least one of the plurality of actuators.

The plurality of actuators may be arranged in rows and columns. A first actuator of the plurality of actuators is in a first row and a first column and a second actuator is in a first row and a second column. A first photonic structure of the plurality of photonic structures is interconnected to the first and second actuators. The first photonic structure may be operatively connected to a second end of the first actuator and a first end of the second actuator.

In accordance with a further aspect of the present invention, a method of fabricating a tunable photonic device is provided. The method includes the steps of interconnecting a dissolvable layer to the actuator and interconnecting the actuator to a transfer layer. The dissolvable layer is dissolved and the actuator is interconnected to a support on a substrate.

A mold cavity is filled with a mixture and the mixture is cured to form the actuator. Prior to interconnecting the actuator to a support on a substrate, a photonic structure may be affixed to an actuator and the transfer layer is separated from the actuator. A photonic element is positioned in a resin mold cavity and a resin is deposited in the resin mold cavity. The resin is cured in the resin mold cavity. The cured resin and the photonic element define the photonic structure. The resin mold cavity is formed in a photonic layer and the method may include the additional steps of aligning the actuator with the support and removing the photonic structure from the resin mold cavity after the actuator is interconnected to the support.

The actuator may be a first actuator, the dissolvable layer may be a first dissolvable layer, and the transfer layer may be a first transfer layer. A plurality of actuators may be fabricated and the first actuator is one of the plurality of actuators. A second dissolvable layer is interconnected to the plurality of actuators and the plurality of actuators is interconnected to a second transfer layer. The second dissolvable layer is dissolved and the first actuator is interconnected to an intermediate layer. The intermediate layer moves the first actuator to the first dissolvable layer.

BRIEF DESCRIPTION OF THE DRAWINGS

The drawings furnished herewith illustrate a preferred methodology of the present invention in which the above advantages and features are clearly disclosed as well as others which will be readily understood from the following description of the illustrated embodiment.

In the drawings.

DETAILED DESCRIPTION OF THE DRAWINGS

Figure 1:
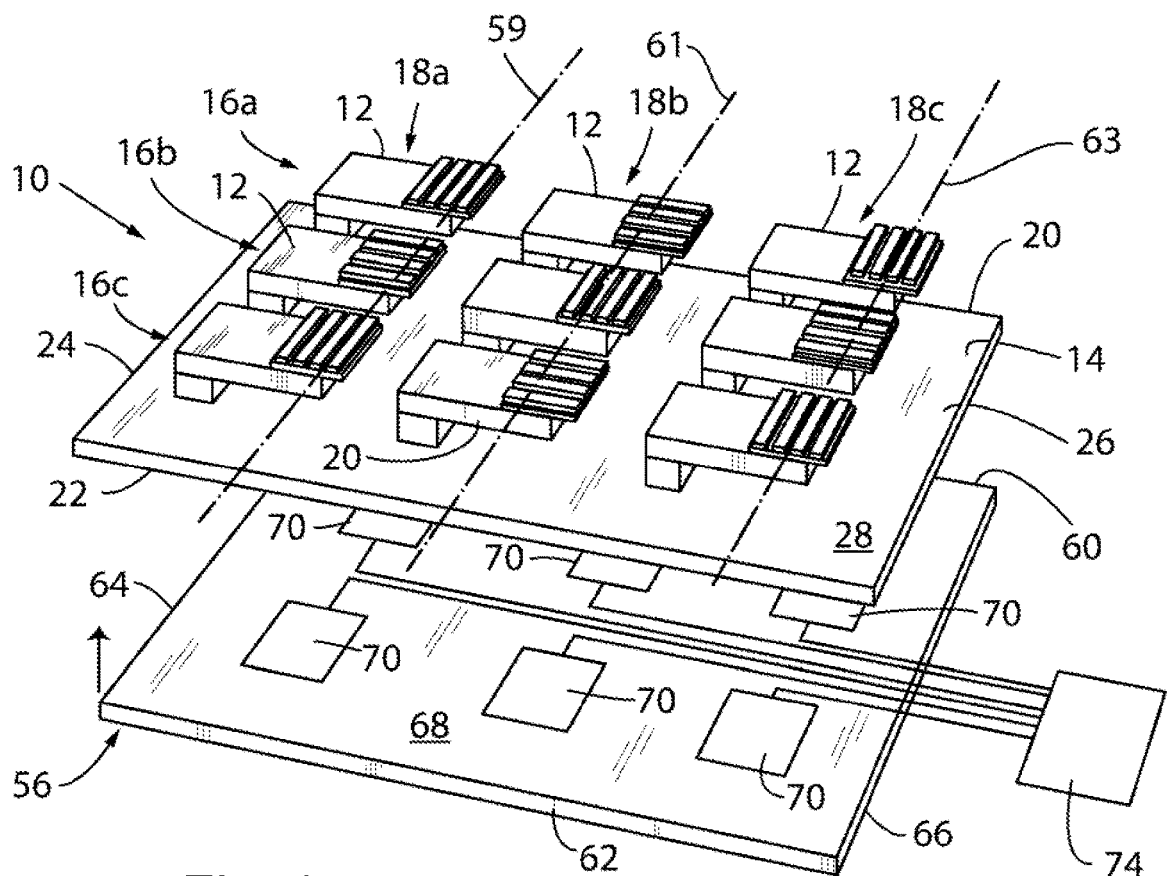
FIG. 1 is an exploded, isometric view of a tunable photonic device in accordance with the present invention.
Figure 2:
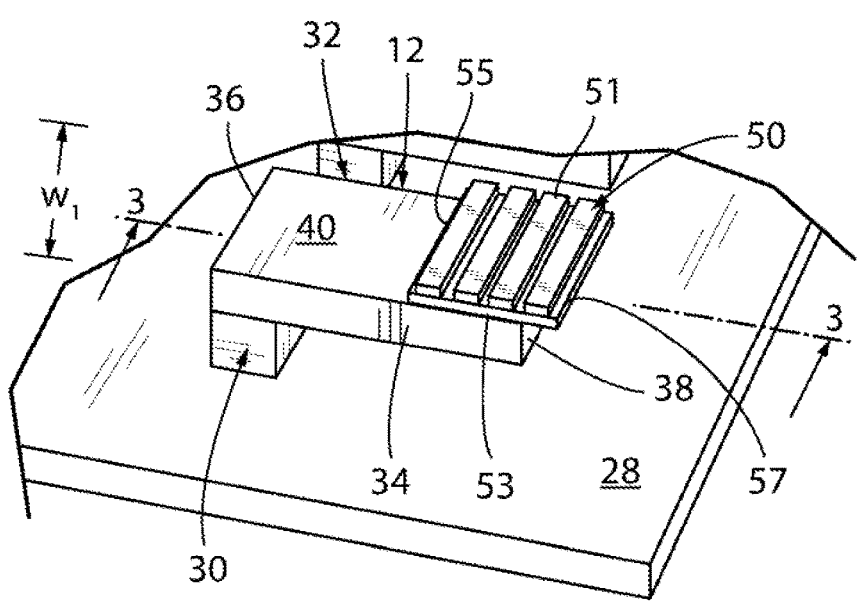
FIG. 2 is an enlarged, isometric view of the tunable photonic device of FIG. 1.

Referring to FIGS. 1-5, a tunable photonic device in accordance with the present invention is generally designated by reference numeral 10. It is intended for photonic device 10 to include a plurality of liquid crystal elastomer (LCE) actuators 12 arranged on substrate 14. As is known, LCEs are cross-linked polymer networks that include rigid, anisotropic mesogenic units incorporated into polymer chains. Due to the anisotropic nature of these units, LCEs exhibit a liquid crystalline structure in which the mesogenic units have a certain orientational order, but remain individually mobile and thus could flow with respect to one another. In response to an external stimulus, the orientational order of the mesogenic units in the LCE may be altered, thereby causing the spontaneous deformation of the LCE. By controlling the orientation, magnitude and/or direction of the external stimulus applied to the LCE, the deformation of the LCE can be controlled in a predictable and repeatable manner, for reasons hereinafter described.

In the depicted embodiment, substrate 14 has a generally rectangular configuration and is defined by first and second parallel sides 20 and 22, respectively, and first and second parallel ends 24 and 26, respectively. First and second ends 24 and 26, respectively, are generally perpendicular to first and second parallel sides 20 and 22, respectively. However, it can be appreciated that substrate 14 may have other configurations without deviating from the scope of the present invention.

Figure 3:
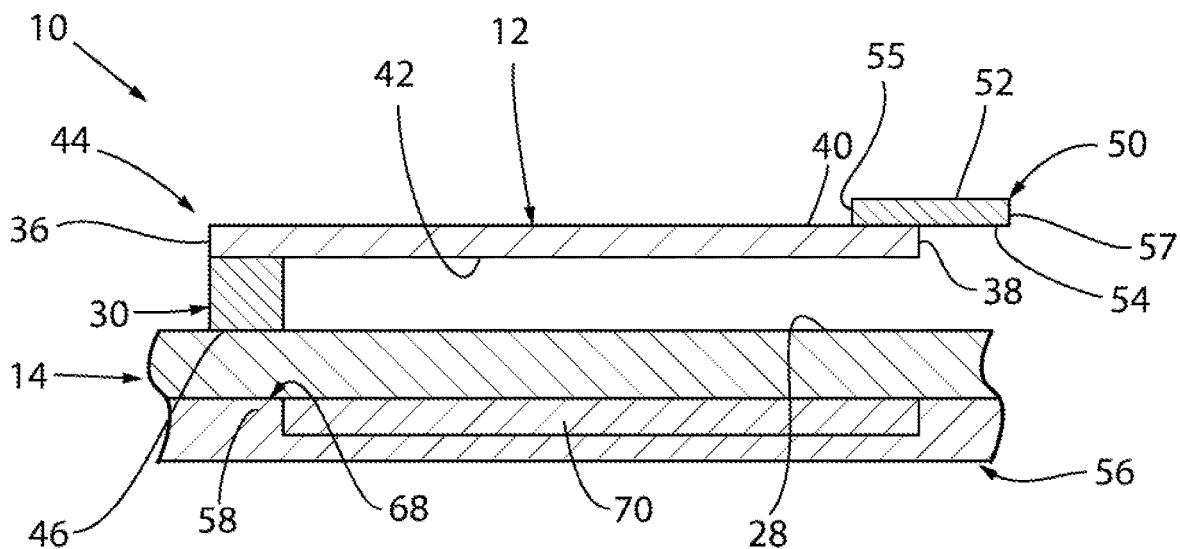
FIG. 3 is a cross-sectional view of the tunable photonic device of the present invention taken along line 3-3 of FIG. 2.
Figure 4:
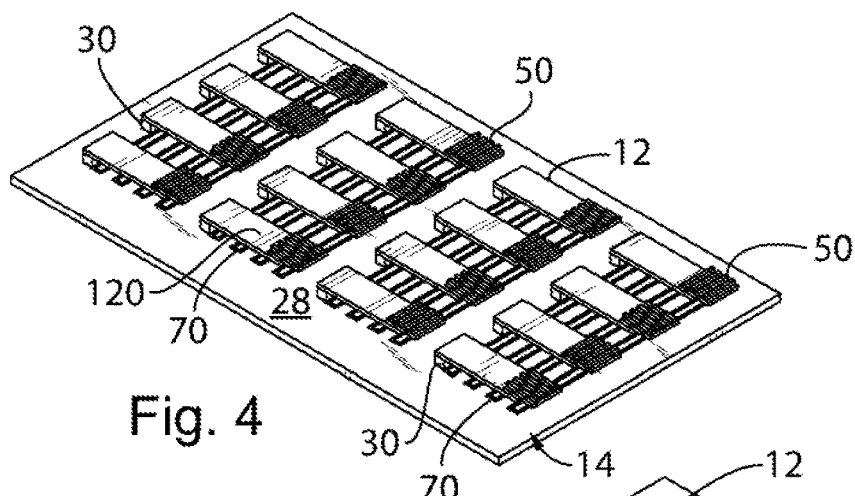
FIG. 4 is an isometric view of a tunable photonic device in accordance with the present invention in an initial configuration and incorporating an alternate microheater arrangement.
Figure 5:
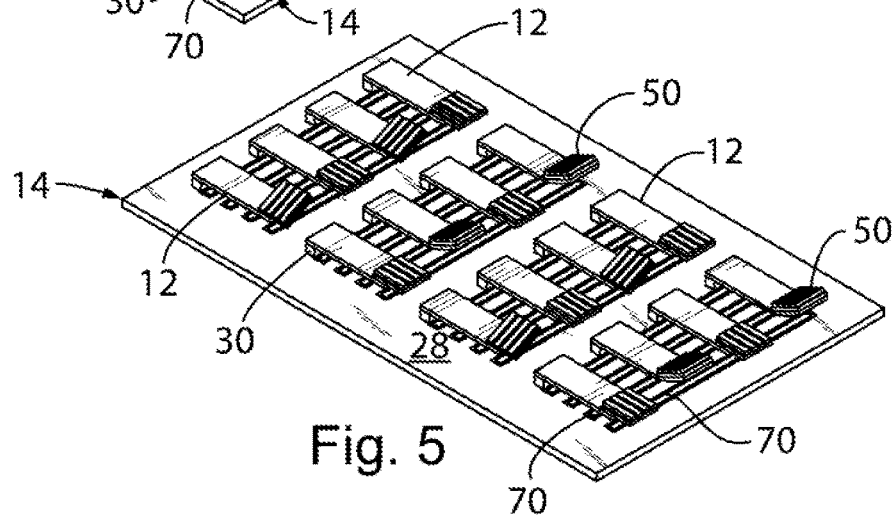
FIG. 5 is an isometric view of a tunable photonic device of FIG. 4 in an actuated configuration.

The plurality of LCE actuators 12 is arranged on substrate 14 in rows 16a-16c and columns 18a-18c. Each of the plurality of LCE actuators 12 is identical in structure. As such, the description hereinafter of LCE actuator 12 located at row 16c, column 18c is understood to describe each of the plurality of LCE actuators 12 on substrate 14 as if fully described herein. As best seen in FIGS. 3 and 4, LCE actuator 12 located at row 16c, column 18c is supported above upper surface 28 of substrate 14 by anchor 30. By way of example, LCE actuator is defined by first and second sides 32 and 34, respectively, and first and second ends 36 and 38, respectively. However, it can be appreciated that LCE actuator 12 may have other configurations without deviating from the scope of the present invention. First and second sides 32 and 34, respectively, of LCE actuator define a width W1 of LCE actuator 12 therebetween. LCE actuator 12 includes upper surface and lower surface 42 bonded to upper surface 44 of anchor 30 adjacent to first end 36 of LCE actuator 12. Lower surface 46 of anchor 30 is bonded to upper surface 28 of substrate 14 such that LCE actuator 12 is cantilevered over upper surface 28 of substrate 14.

Each of the plurality of LCE actuators 12 includes a corresponding photonic structure 50 mounted thereto and lying in a corresponding plane. As is known, each photonic structure 50 is a micro or nano structure that scatters, refracts, confines, filters and/or processes light. More specifically, each photonic structure 50 has a generally square configuration and is defined by first and second parallel sides 51 and 53, respectively, and first and second parallel ends 55 and 57, respectively. First and second ends 55 and 57, respectively, are generally perpendicular to first and second parallel sides 51 and 53, respectively. However, it can be appreciated that photonic structures 50 may have other configurations without deviating from the scope of the present invention. First and second sides 51 and 52, respectively, are spaced by width W1 and first and second ends 55 and 57, respectively, are spaced by width W1. Each photonic structure 50 further includes an upper surface 52 and a lower surface 54 bonded to upper surface 40 of a corresponding LCE actuator 12 adjacent to second end 38 of the corresponding LCE actuator 12 such that each photonic structure 50 is cantilevered over upper surface 28 of substrate 14. In the depicted embodiment, in an initial configuration, photonic structures 50 lie in a common plane generally parallel to upper surface 28 of substrate 14. However, it can be appreciated photonic structures 50 may lie in corresponding planes that intersect upper surface 28 of substrate 14 without deviating from the scope of the present invention.

Photonic structures 50 bonded to LCE actuators 12 in column 18a are aligned with each other and axially spaced along axis 59 by a predetermined distance. Similarly, photonic structures 50 bonded to LCE actuators 12 in column 18b are aligned with each other and axially spaced along axis 61 by a predetermined distance and photonic structures 50 bonded to LCE actuators 12 in column 18c are aligned with each other and axially spaced along axis 63 by a predetermined distance.

Alternatively, referring to FIGS. 6-9, photonic device 10 may include an additional row 16d and an additional column 18d of LCE actuators 12 may be provided on substrate 14. In such arrangement, photonic structures 50 bonded at second ends 38 of LCE actuators 12 in column 18a are also bonded to upper surfaces 40 of corresponding LCE actuators 12 in column 18b at first ends 36 thereof. Similarly, photonic structures 50 bonded at second ends 38 of LCE actuators 12 in column 18b are also bonded to upper surfaces 40 of corresponding LCE actuators 12 in column 18c at first ends 36 thereof and photonic structures 50 bonded at second ends 38 of LCE actuators 12 in column 18c are also bonded to upper surfaces 40 of corresponding LCE actuators 12 in column 16d adjacent at first ends 36 thereof.

Figure 6:
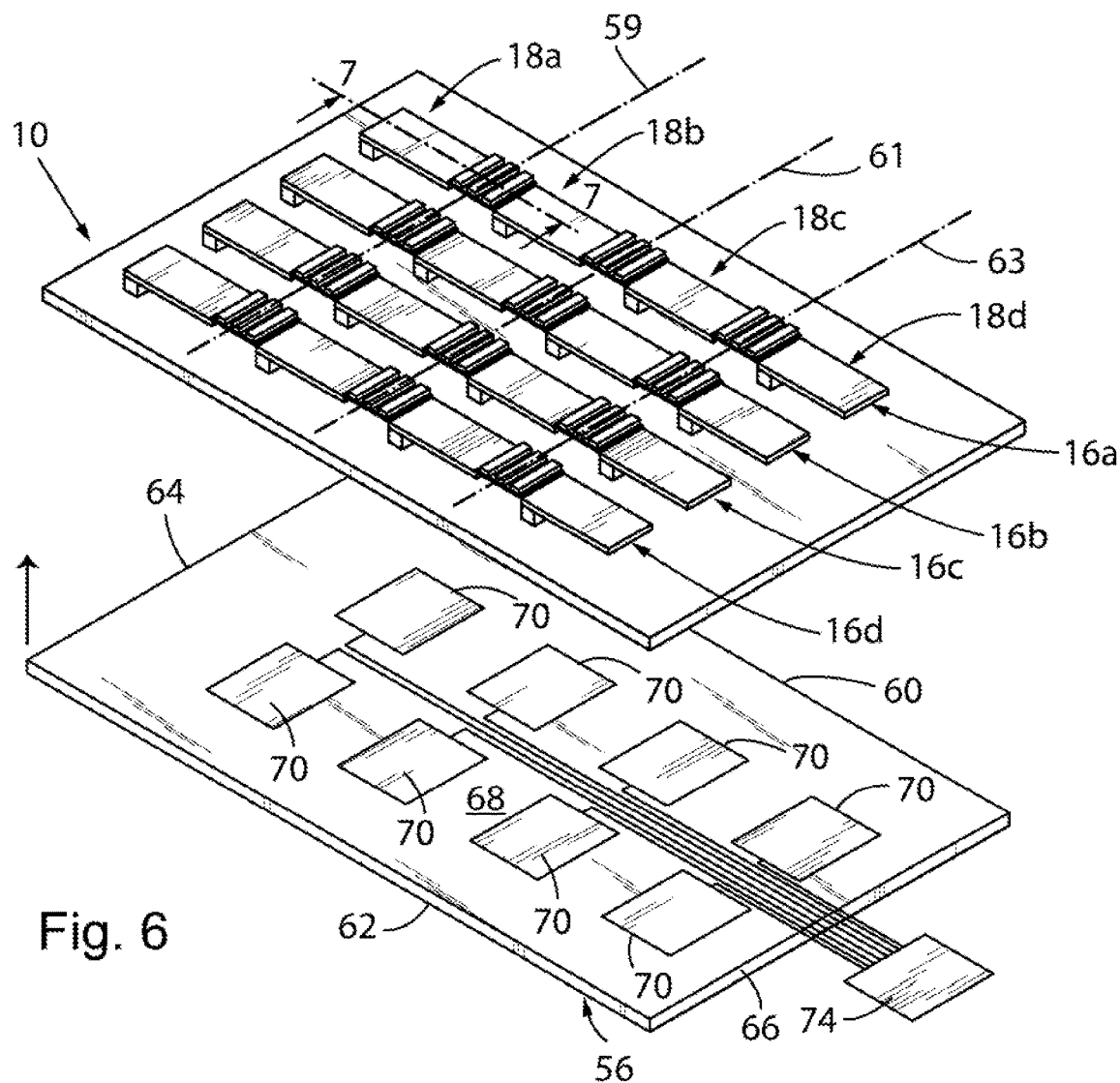
FIG. 6 is an exploded, isometric view of an alternate configuration of a tunable photonic device in accordance with the present invention.
Figure 7:
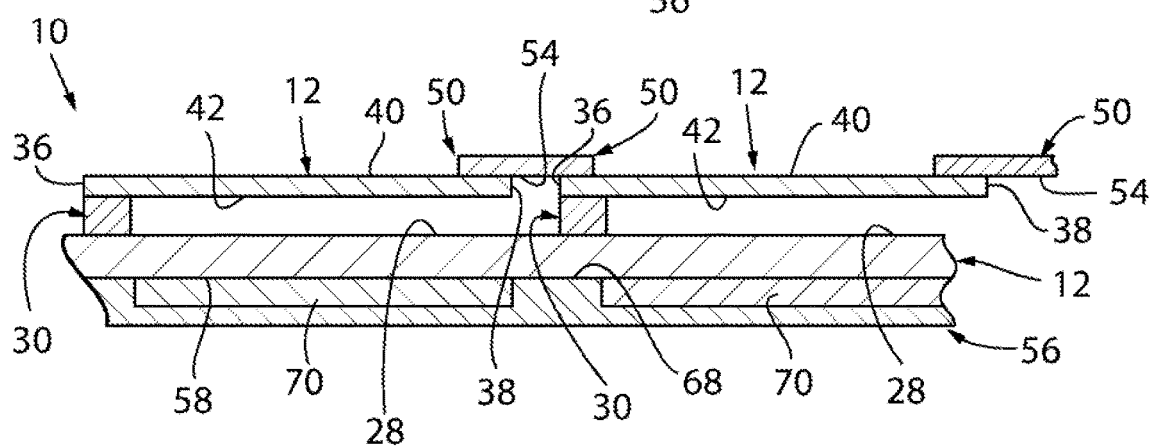
FIG. 7 is a cross-sectional view of the tunable photonic device of the present invention taken along line 7-7 of FIG. 6.

Referring to FIGS. 1 and 6, it is contemplated to provide a stimulus structure, generally designated by the reference numeral 56, adjacent lower surface 58 of substrate 14. It is intended for stimulus structure 56 to generate one or more stimuli such as heat, light, electricity and/or chemical stimuli to stimulate the plurality of LCE actuators 12 and cause the compressing, bending, or twisting motion thereof. It can be understood that by compressing, bending, or twisting the plurality of LCE actuators 12, the position or angle of photonic structures 50 may be adjusted, thereby allowing the optical properties of photonic structures 50 to be tuned, FIGS. 5 and 9. As such, in an actuated configuration, the positions of photonic structures 50 are adjusted from the initial configuration to corresponding actuated planes. For example, the positions of photonic structures 50 may be vertically adjusted so as to lie in an actuated plane generally parallel to upper surface 28 of substrate 14 or tilted or twisted so as to lie in corresponding actuated planes that intersect upper surface 28 of substrate 14.

By way of example, stimulus structure 56 has a generally rectangular configuration and is defined by first and second parallel sides 60 and 62, respectively, and first and second parallel ends 64 and 66, respectively. First and second ends 64 and 66, respectively, are generally perpendicular to first and second sides 60 and 62, respectively. However, it can be appreciated that stimulus structure 56 may have other configurations without deviating from the scope of the present invention. A plurality of microheaters 70 is embedded in upper surface 68 of stimulus structure 56. Each of the plurality of microheaters 70 is aligned with a corresponding one of the plurality of LCE actuators 12 and is operatively connected to controller 74. It is intended for controller 74 to selectively activate one or more of the plurality of microheaters 70 to selectively cause one or more of the plurality of LCE actuators 12 to compress, bend, or twist and cause position or angle of photonic structures 50 to be adjusted in a desired manner to tune the optical properties of photonic structures 50.

Alternatively, referring to FIGS. 4-5 and 8-9, instead of a separate stimulus structure 56 disposed adjacent lower surface 58 of substrate 14, the stimulus structure may be defined by embedding the plurality of microheaters 70 in upper surface 28 of substrate 14. Each of the plurality of microheaters 70 is aligned with a corresponding one of the plurality of LCE actuators 12 mounted on upper surface 28 of substrate 14. Controller 74 is operatively connected to each of the plurality of microheaters 70 embedded in upper surface 28 of substrate 14. As described above, it is intended for controller 74 to selectively activate one or more of the plurality of microheaters 70 to selectively cause one or more of the plurality of LCE actuators 12 to compress, bend, or twist in response thereto, thereby causing the position and/or angle of photonic structures 50 to be adjusted in a desired manner and tuning the optical properties of photonic structures 50, FIGS. 5 and 9.

Figure 10:
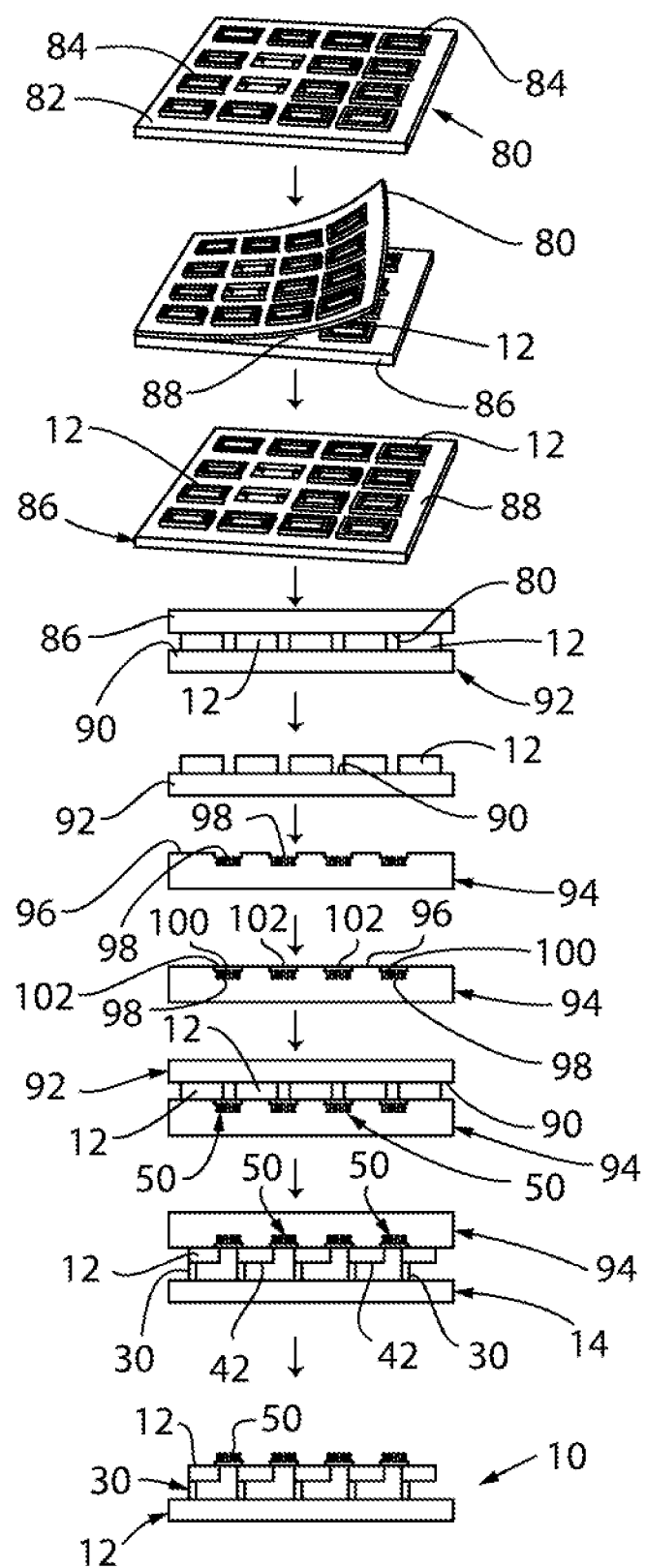
FIG. 10 is a flow diagram showing a method of fabrication of a tunable photonic device in accordance with the present invention.

Referring to FIG. 10, in order to fabricate photonic device 10, anchors 30 are aligned and bonded to upper surface 28 of substrate 14 to support LCE actuators in rows 16a-16d and columns 18a-18d, as heretofore described. In addition, first mold 80 is fabricated from a flexible polymer material, such a perfluoropolyether (PFPE), which has a high resistance to solvents, acids and bases. First mold 80 includes an upper surface 82 having a plurality of mold cavities 84 formed therein which correspond in size and shape to LCE actuators 12. Mold cavities 84 are arranged in rows 16a-16d and columns 18a-18d, as heretofore described, and are configured for receiving a LCE mixture therein. The LCE mixture is deposited in mold cavities 84 in a conventional manner, and thereafter, cured therein by directing a predetermined stimulus, e.g., ultraviolet (UV) light, at the LCE mixture in mold cavities 84. The curing process solidifies the LCE mixture within mold cavities 84 so as to form LCE actuators 12. Once LCE actuators 12 are formed in mold cavities 84, layer 86 of a water-soluble polymer, e.g., polyvinyl acetate (PVA), is deposited on upper surface 82 of first mold 80 over mold cavities 84 and allowed to dry. As layer 86 dries, the polymer solidifies such that surface 88 of solidified layer 86 adhesively bonds to LCE actuators 12. It is noted that the adhesive bond between the cured LCE actuators 12 and solidified layer 86 is greater than the adhesive bond between the cured LCE actuators 12 and first mold 80. As such, LCE actuators 12 remain affixed to surface 88 of solidified layer 86 as first mold 80 is peeled away from solidified layer 86 and the LCE actuators 12 bonded thereto.

Once bonded to surface 88 of solidified layer 86, it is contemplated to transfer LCE actuators 12 to transfer layer 92 fabricated from an optically clear polymer such as polydimethylsiloxane (PDMS). More specifically, solidified layer 86 is inverted such that LCE actuators 12 bonded to surface 88 of solidified layer 86 are aligned with a corresponding surface 90 of transfer layer 92. LCE actuators 12 are brought into contact with surface 90 of transfer layer 92 such that LCE actuators 12 are captured between solidified layer 86 and transfer layer 92. Thereafter, solidified layer 86 is dissolved in water leaving LCE actuators 12 bonded to transfer layer 92.

Second mold 94 includes upper surface 96 having a plurality of mold cavities 98 formed therein. Each mold cavity 98 is disposed in upper surface 96 of second mold 94 so as to be aligned with a corresponding LCE actuator 12 in rows 16a-16d and columns 18a-18d, heretofore described. More specifically, each mold cavity 98 is disposed in upper surface 96 of second mold 94 so as to be aligned with either: 1) upper surface 40 of a corresponding LCE actuator 12 at second end 38 of the corresponding LCE actuator 12 if it is intended for each photonic structure 50 to be cantilevered over upper surface 28 of substrate 14, FIG. 1; or 2) both upper surface 40 of a first corresponding LCE actuator 12 at second end 38 of the corresponding first LCE actuator 12 and upper surface 40 of a second corresponding LCE actuator 12 at first end 36 of the corresponding second LCE actuator 12 if it is intended for an individual photonic structure 50 to be interconnected to LCE actuators 12 in adjacent columns, FIG. 6.

Each mold cavity 98 in upper surface 96 of second mold 94 is configured to receive one or more photonic elements 100 therein. Resin 102 is poured into mold cavities 98 in upper surface 96 of second mold 94, and thereafter, transfer layer 92 is inverted and brought adjacent to second mold 94 such that LCE actuators 12 bonded to surface 90 of transfer layer 92 are aligned with and engage resin 102. A predetermined stimulus, e.g., ultraviolet (UV) light, is directed at resin 102 in mold cavities 98 in upper surface 96 of second mold 94 so as to: 1) cure and solidify resin 102 therein thereby forming the plurality of photonic structures 50, heretofore described; and 2) interconnecting each of the plurality of photonic structures 50 to an individual LCE actuator 12, FIG. 1, and to first and second LCE actuators 12 in adjacent columns, FIG. 6.

With the plurality of photonic structures 50 interconnected to the plurality of LCE actuators 12, as heretofore described, transfer layer 92 is separated from LCE actuators 12. An uncured resin is provided on anchors 30 bonded to substrate 14, as heretofore described, and second mold 94 is inverted and brought adjacent to substrate 14 such that lower surfaces 42 of LCE actuators 12 are brought into contact with upper surfaces 44 of corresponding anchors 30 adjacent to first ends 36 of LCE actuators 12. A predetermined stimulus, e.g., ultraviolet (UV) light, is directed at the resin provided on anchors 30 so as to interconnect and bind upper surfaces 44 of corresponding anchors 30 to first ends 36 of LCE actuators 12. Once LCE actuators 12 are interconnected to corresponding anchors 30, second mold 94 is separated from photonic structures 50, thereby forming the completed photonic device 10.

Figure 11:
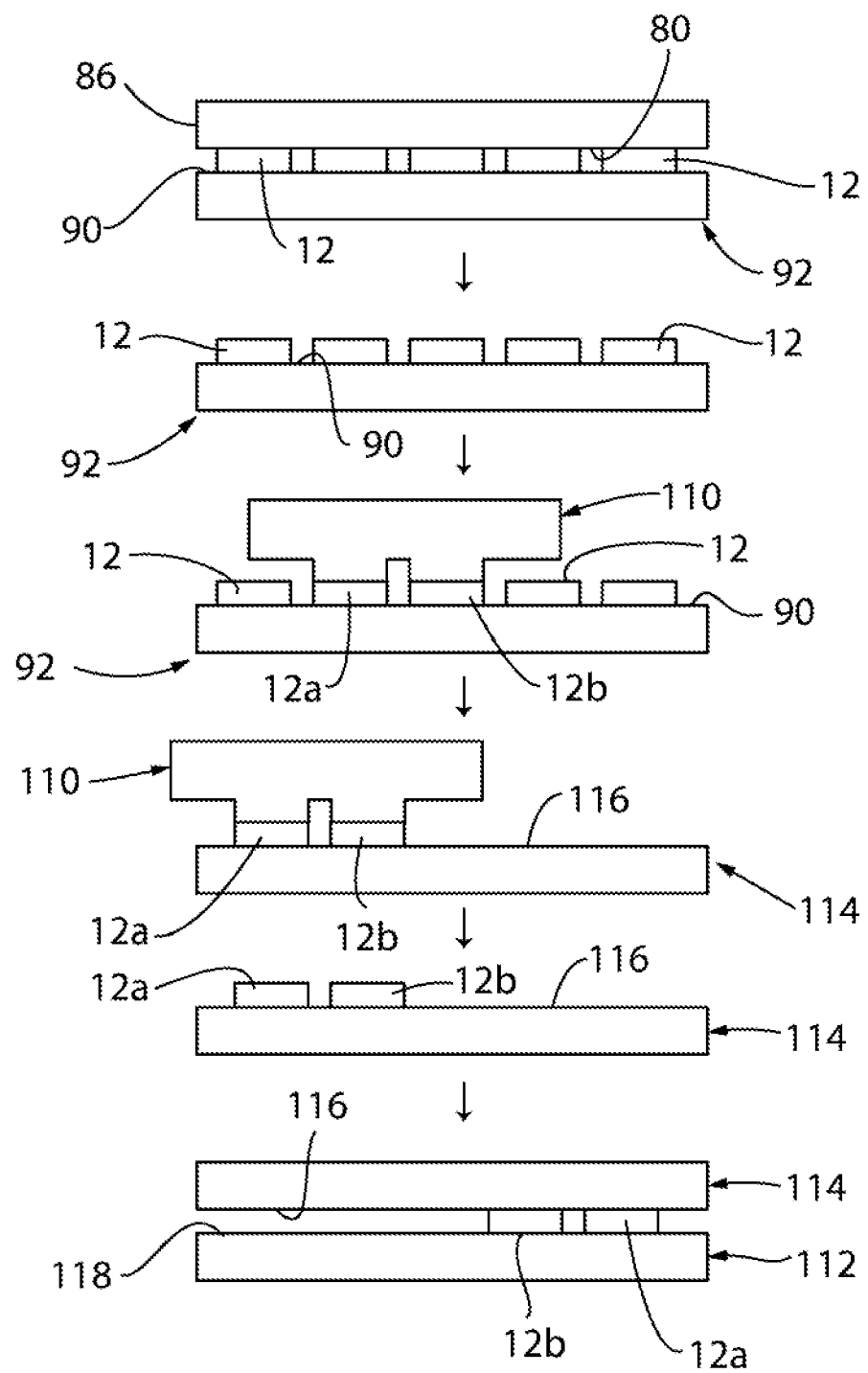
FIG. 11 is a flow diagram showing an alternate method of fabrication of a tunable photonic device in accordance with the present invention.

Referring to FIG. 11, in order to customize photonic device 10, it is contemplated to transfer a portion of LCE actuators 12 from transfer layer 92 to anchor 30 projecting from upper surface 28 of substrate 14, if anchors 30 projecting from upper surface 28 of substrate 14 cannot be aligned with all of LCE actuators 12 provided on transfer layer 92, as heretofore described. In order to transfer a portion of LCE actuators 12 from transfer layer 92, second and third transfer layers 110 and 112, respectively, are provided. More specifically, in order to transfer LCE actuators 12a and 12b from transfer layer 92, second transfer 110 formed from a curable resin is brought into contact with LCE actuators 12a and 12b. A predetermined stimulus, e.g., ultraviolet (UV) light, is directed at second transfer layer 110 and cures the resin, thereby interconnecting and binding second transfer layer 110 to LCE actuators 12 and 12b. It is noted that the adhesive bond between second transfer layer 110 and LCE actuators 12a and 12b is greater than the adhesive bond between LCE actuators 12a and 12b and transfer layer 92. As such, LCE actuators 12a and 12b remain affixed to second transfer layer 110 as second transfer layer 110 is spaced from transfer layer 92.

Second transfer layer 110 is positioned adjacent layer 114 of a water-soluble polymer, e.g., polyvinyl acetate (PVA) such that LCE actuators 12a and 12b contact layer 114. Layer 114 is dried and solidified such that surface 116 of layer 114 adhesively bonds to LCE actuators 12a and 12b. Thereafter, second transfer layer 110 is removed from LCE actuators 12a and 12b. Solidified layer 114 is inverted such that LCE actuators 12a and 12b bonded to surface 116 of solidified layer 114 are aligned with a corresponding surface 118 of third transfer layer 112. LCE actuators 12a and 12b are brought into contact with surface 118 of third transfer layer 112 such that LCE actuators 12a and 12b are captured between solidified layer 114 and third transfer layer 112. Thereafter, solidified layer 114 is dissolved in water leaving LCE actuators 12a and 12b bonded to third transfer layer 112. Third transfer layer 112 may then be used to align and bind LCE actuators 12a and 12b to corresponding anchors 30 projecting from upper surface 28 of substrate 14, as heretofore described.

Figure 8:
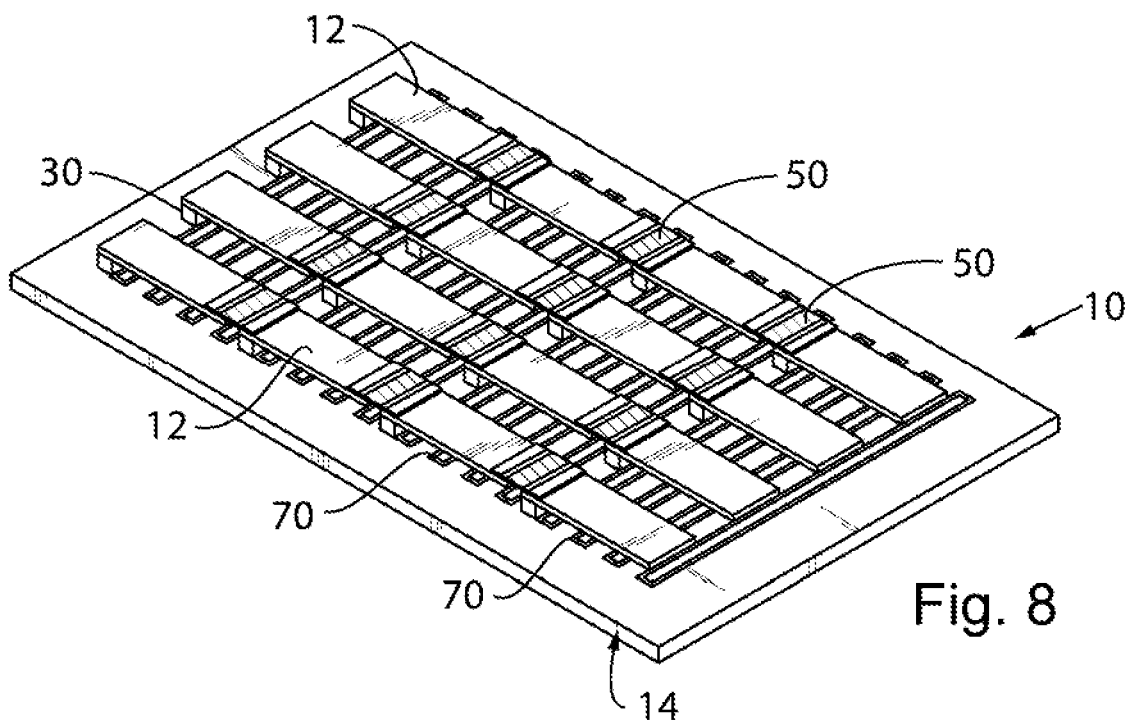
FIG. 8 is an isometric view of a tunable photonic device in accordance with the present invention in an initial configuration and incorporating an alternate microheater arrangement.
Figure 9:
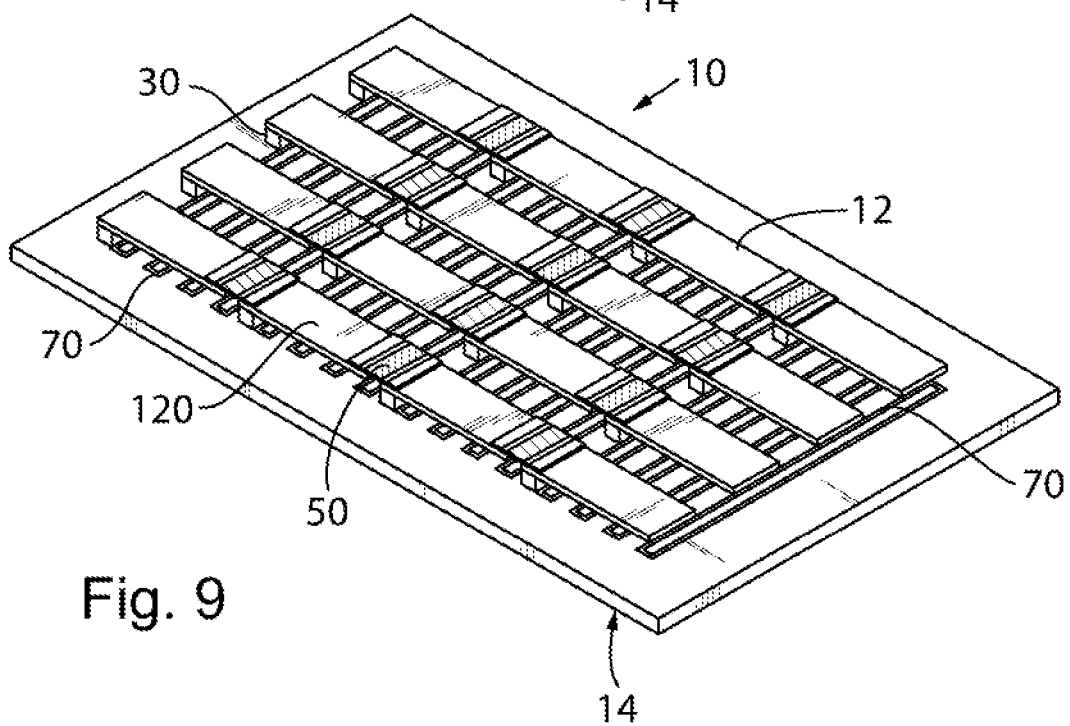
FIG. 9 is an isometric view of a tunable photonic device of FIG. 8 in an actuated configuration.

In operation, light is directed at the plurality of photonic structures 50 of photonic device 10, as heretofore described, FIGS. 4 and 8. Thereafter, controller 74 selectively activates one or more of the plurality of microheaters 70 to selectively cause one or more of the plurality of LCE actuators 12 of photonic device 10 to compress, bend, or twist, thereby adjusting the position or angle of photonic structures 50, FIGS. 5 and 9. By adjusting the position or angle of photonic structures 50, the optical properties of the light directed at photonic device 10 may be tuned.

Various modes of carrying out the invention are contemplated as being within the scope of the following claims particularly pointing out and distinctly claiming the subject matter that is regarded as the invention.

We claim:
1. A tunable photonic device, comprising:
   a substrate having an upper surface;
   an actuator having a first end supported by the substrate and a second end in spaced relation to the substrate;
   a photonic structure operatively connected to the actuator and being movable between a first position wherein the photonic structure lies in a first plane and a second position wherein the photonic structure lies in a second plane, the photonic structure being configured to perform one or more of scattering, refracting, confining, filtering and processing light; and
   a stimulus generator configured to selectively generate a stimulus to act on the actuator;

wherein the stimulus acting on the actuator causes deformation of the actuator and moves the photonic structure between the first and second positions, and the stimulus is heat and the stimulus generator includes a microheater configured to generate heat to act on the actuator.

2. The tunable photonic device of claim 1 wherein the actuator is fabricated from a liquid crystal elastomer.

3. The tunable photonic device of claim 1 further comprising an anchor interconnecting the actuator and the substrate, the anchor supporting the first end of actuator in spaced relation to the upper surface of the substrate.

4. The tunable photonic device of claim 1 wherein the microheater is embedded in the upper surface of the substrate.

5. The tunable photonic device of claim 1 wherein the microheater is positioned adjacent a lower surface of the substrate.

6. The tunable photonic device of claim 1 wherein:
the actuator is a first actuator and the photonic structure is a first photonic structure; and
the tunable photonic device further comprises:
a second actuator having a first end supported by the substrate and a second end in spaced relation to the substrate; and
a second photonic structure operatively connected to the second end of the second actuator and being movable between a first position wherein the second photonic structure lies in the first plane and a second position wherein the second photonic structure lies in a third plane, the second photonic structure being configured to perform one or more of scattering, refracting, confining, filtering and processing light.

7. The tunable photonic device of claim 6 wherein the stimulus generator is a first stimulus generator and wherein the tunable photonic device further comprises a second stimulus generator configured to selectively generate a stimulus to act on the second actuator.

8. The tunable photonic device of claim 6 wherein the first photonic structure is operatively connected to the first end of the second actuator.

9. The tunable photonic device of claim 1 wherein the photonic structure is operatively connected to the second end of the actuator.

10. A tunable photonic device, comprising:
a substrate having an upper surface;
a plurality of actuators arranged in a pattern on the upper surface of the substrate;
a plurality of photonic structures, each photonic structure operatively connected to at least one of the plurality of actuators and being movable between a first position wherein the photonic structure lies in a first plane and a second position wherein the photonic structure lies in a second plane; and
a stimulus generator configured to generate a stimulus to selectively act on one or more of the plurality of actuators;
wherein the stimulus acting on the one or more of the plurality of actuators causes one or more of the plurality of photonic structure operatively connected to the one or more of the plurality of actuators to move between the first and second positions, and the stimulus is heat and the stimulus generator includes a plurality of microheaters, each microheater generating heat to act on at least one of the plurality of actuators.

11. The tunable photonic device of claim 10 wherein the plurality of actuators is fabricated from liquid crystal elastomers.

12. The tunable photonic device of claim 10 further comprising a plurality of anchors, each anchor interconnecting a first end of one of the plurality of actuators and the substrate and supporting the first end of actuator in spaced relation to the upper surface of the substrate.

13. The tunable photonic device of claim 10 wherein the plurality of microheaters is embedded in the upper surface of the substrate.

14. The tunable photonic device of claim 10 wherein the plurality of microheaters positioned adjacent a lower surface of the substrate, each of the plurality of microheaters generating heat to act on at least one of the plurality of actuators.

15. The tunable photonic device of claim 10 wherein the plurality of actuators is arranged in rows and columns.

16. The tunable photonic device of claim 15 wherein a first actuator of the plurality of actuators is in a first row and a first column and a second actuator is in a first row and a second column, a first photonic structure of the plurality of photonic structures being interconnected to the first and second actuators.

17. The tunable photonic device of claim 16 wherein the first photonic structure is operatively connected to a second end of the first actuator and a first end of the second actuator.

18. A method of fabricating a tunable photonic device, comprising the steps of:
interconnecting a dissolvable layer to the actuator;
interconnecting the actuator to a transfer layer;
dissolving the dissolvable layer; and
interconnecting the actuator to a support on a substrate.

19. The method of claim 18 comprising the additional steps of:
filling a mold cavity with a mixture; and
curing the mixture to form the actuator.

20. The method of claim 18 wherein prior to interconnecting the actuator to a support on a substrate, comprising the additional steps of:
affixing a photonic structure to an actuator; and
separating the transfer layer from the actuator.

21. The method of claim 20 comprising the additional steps of:
placing a photonic element in a resin mold cavity;
depositing a resin in the resin mold cavity; and
curing the resin in the resin mold cavity;
wherein the cured resin and the photonic element define the photonic structure.

22. The method of claim 21 wherein the resin mold cavity is formed in a photonic layer and wherein the method comprising the additional steps of:
aligning the actuator with the support; and
removing the photonic structure from the resin mold cavity after the actuator is interconnected to the support.

23. The method of claim 18 wherein the actuator is a first actuator, the dissolvable layer is a first dissolvable layer, and the transfer layer is a first transfer layer, the method comprising the additional steps of:
fabricating a plurality of actuators, the first actuator being one of the plurality of actuators;
interconnecting a second dissolvable layer to the plurality of actuators;
interconnecting the plurality of actuators to a second transfer layer;
dissolving the second dissolvable layer;
interconnecting the first actuator to an intermediate layer, the intermediate layer moving the first actuator to the first dissolvable layer.

* * * * *